United States Patent [19]

Kuwahara

[11] 4,410,859

[45] Oct. 18, 1983

[54] SIGNAL AMPLIFIER CIRCUIT ARRANGEMENT WITH OUTPUT CURRENT LIMITING FUNCTION

[75] Inventor: Hisao Kuwahara, Kamakura, Japan

[73] Assignee: Tokyo Shibaura Denki Kabushiki Kaisha, Kawasaki, Japan

[21] Appl. No.: 316,633

[22] Filed: Oct. 30, 1981

Related U.S. Application Data

[63] Continuation of Ser. No. 117,278, Jan. 31, 1980.

[30] Foreign Application Priority Data

Feb. 5, 1979 [JP] Japan ................................. 54/12060

[51] Int. Cl.³ ........................................... H03F 3/45
[52] U.S. Cl. ................................... 330/298; 330/257; 330/311
[58] Field of Search ................. 330/207 P, 257, 288, 330/298, 311

[56] References Cited

U.S. PATENT DOCUMENTS 4,023,111 5/1977 Mortensen .................. 330/207 P X

FOREIGN PATENT DOCUMENTS 1352913 5/1974 United Kingdom.
1413824 11/1975 United Kingdom.
1426089 2/1976 United Kingdom.
1503951 3/1978 United Kingdom.
1518961 7/1978 United Kingdom.

OTHER PUBLICATIONS

Bilotti et al., "An Integrated Two-Watt Sound System for Television Applications", *IEEE Transactions on Broadcast and Television Receivers*, vol. BTR-18, No. 4, Nov. 1972, pp. 255-262.

*Primary Examiner*—James B. Mullins
*Attorney, Agent, or Firm*—Finnegan, Henderson, Farabow, Garrett & Dunner

[57] ABSTRACT

A signal amplifier circuit arrangement includes an input amplifying circuit having a current mirror load circuit and an output transistor having its base connected to the output of the input amplifying circuit, its collector connected to the output terminal of the signal amplifying circuit and its emitter connected to a power supply terminal. In the signal amplifier circuit arrangement a current detection resistor is connected between the emitter of the output transistor and the power supply terminal and a diode is connected between the emitter or collector of the output transistor and the collector of a diode-connected transistor of the current mirror circuit. When a large current flows through the output transistor due to the short-circuiting of the output terminal, the diode connected in series with the emitter-base path of a transistor in the current mirror circuit is rendered conductive by a voltage drop developed across the current detection resistor, thus providing a current negative feedback to the base of the output transistor through the current mirror circuit for restricting the collector current of the output transistor.

5 Claims, 4 Drawing Figures

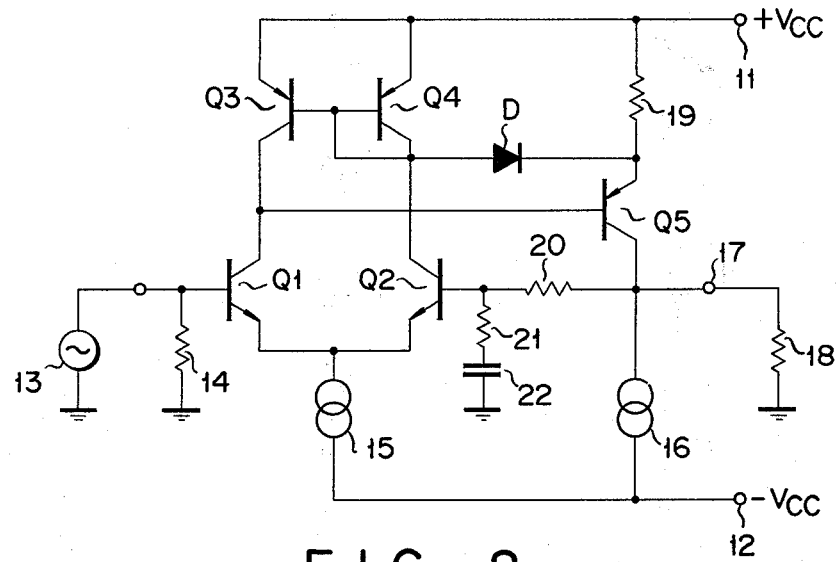
F I G. 2

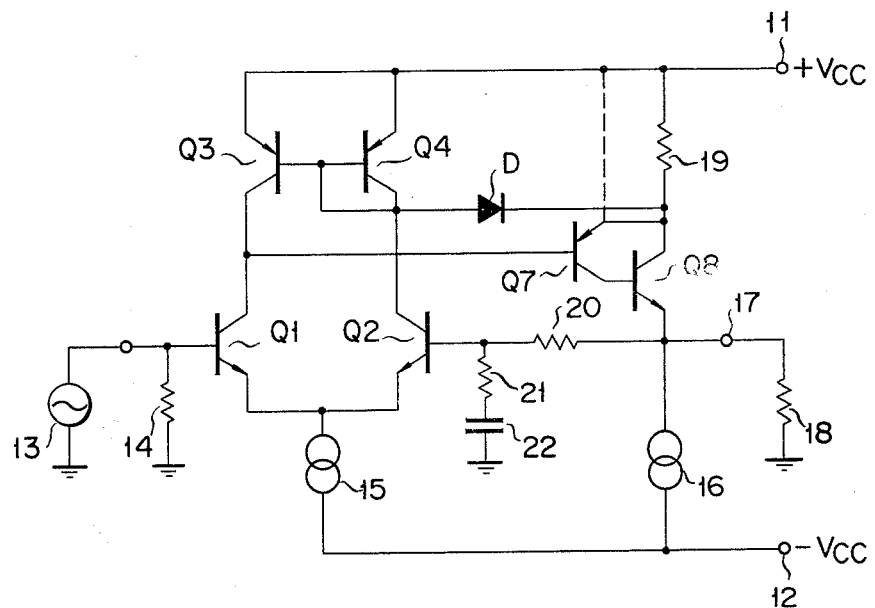
F I G. 3
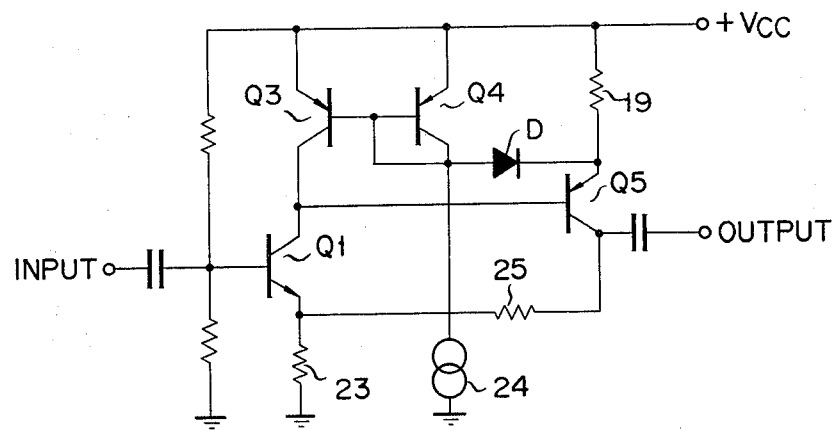
F I G. 4

SIGNAL AMPLIFIER CIRCUIT ARRANGEMENT WITH OUTPUT CURRENT LIMITING FUNCTION

This is a continuation of application Ser. No. 117,278, filed Jan. 31, 1980.

This invention relates to a signal amplifier circuit arrangement and in particular to a signal amplifier circuit arrangement having an output current restricting function.

FIG. 1 shows one form of a conventional signal amplifier circuit for restricting output current when a load connected to an output terminal is short-circuited. The signal amplifier circuit utilizes a differential amplifier as an input amplifying stage having a current-mirror load circuit. That is, the input amplifying stage includes a differential pair of NPN transistors Q1, Q2 whose commonly connected emitters are connected through a constant current source 15 to a negative power supply terminal 12 and PNP transistors Q3 and Q4 connected between the collectors of transistors Q1, Q2 and a positive power supply terminal 11.

In the current mirror circuit, the transistor Q3 has its collector connected to the collector of transistor Q1 and its emitter connected to the positive power supply terminal 11 and its base connected to the base of transistor Q4, and the transistor Q4 has its collector connected to the collector of transistor Q2 and its emitter connected to the positive power supply terminal 11. The transistor Q4 is diode-connected such that its collector is shunted to its base.

In the output stage, a PNP output transistor Q5 has its base connected to the collector of transistor Q3, its collector connected to an output terminal 17 which may be an external terminal of integrated circuit and through a constant current load 16 to the negative power supply terminal 12, and its emitter connected through a protection resistor 19 to the positive power supply terminal 11. A load 18 such as a loudspeaker or other circuits is connected between the output terminal 17 and ground. The output terminal 17 is connected to the base of transistor Q2 through a negative feedback circuit comprised of resistors 20, 21 and capacitor 22. The base of transistor Q1 is connected to ground through a resistor 14 and to a signal source 13.

If, in the signal amplifying circuit, the output terminal 17 is short-circuited to ground a collector current given by $$I_{C5(MAX)} \approx \frac{V_{cc}}{Re}$$

flows through the output transistor Q5, where Re is a resistance value of the protection resistor 19. When the resistance value Re of the protection resistor 19 is large, the collector current of the transistor Q5 at the output terminal short-circuiting time can be limited to a relatively small current, thereby preventing breakdown of the output transistor Q5 resulting from an excess current.

If, however, the resistance value Re of protection resistor 19 is made larger, the output voltage derived from the output terminal 17 becomes lower in the normal condition. That is, the supply voltage utility is reduced. The output voltage VO is given by:

$$VO\ (MAX) = \frac{V_{cc}}{\sqrt{2}} \cdot \frac{Rl}{Re + Rl}$$

where Rl denotes the resistance value of the load 18.

In order to obtain a maximum possible output voltage and prevent the breakdown of the output transistor it will be necessary to use a protection resistor of a smaller resistance value and a large and expensive output transistor with a greater current capacity. Even if this is done, it will be difficult to obtain a sufficient protection effect.

In order to remove such drawback, a protection transistor Q6 may be connected as shown in FIG. 1. Such a means is equivalent to a current limiting means arranged in an output amplifier disclosed in FIG. 8 on page 258 of IEEE TRANSACTION ON BROADCAST AND TELEVISION RECEIVERS, NOVEMBER 1972, volume BTR-18, NUMBER 4.

Where the protection transistor Q6 is so connected, the resistor 19 is used to detect a current flowing through the output transistor Q5. The resistor 19 is selected to have such a value that, when a large current to be limited flows through the output transistor Q5, a voltage drop for rendering the protection transistor Q6 conductive is developed across the resistor 19. When the protection transistor Q6 is rendered conductive the output transistor Q5 is biased to cut-off. When the protection transistor Q6 is provided, the resistor 19 may have a smaller value and the output transistor may also have a smaller current capacity.

Since, however, the collector of transistor Q6 is connected to a high impedance path leading from the collector of transistor Q3 to the base of transistor Q5, an unwanted oscillation tends to occur due to a stray capacitance existing on the path between the collector and base of transistor Q6. Further, due to the stray capacitance, the output current limiting operation is not performed rapidly.

It is an object of this invention to provide an output current limiting signal amplifier circuit which is improved in the supply voltage utility and output current limiting function.

Another object of this invention is to provide an output current limiting signal amplifier circuit which can use an output transistor with a relatively small current capacity to provide a large output voltage nearly equal to a supply voltage.

Still another object of this invention is to provide an output current limiting signal amplifier which is suitable for an integrated circuit.

In a signal amplifier circuit arrangement of this invention, an input amplifier stage includes a current mirror load circuit having first and second transistor of a first conductivity type, the first and second transistor having their emitters connected to a power supply terminal and their bases connected to each other and the second transistor having its collector coupled to its base; an output stage includes a output transistor means of the first conductivity type having its base connected to the collector of the first transistor, its collector connected to an output terminal of the signal amplifier circuit and its emitter connected through a current detection resistance element to the power supply terminal; and a protection diode is connected between the commonly-connected bases of the first and second transistors and the emitter of the output transistor means.

When a large current above a predetermined current flows through the output transistor means i.e. the current detection resistor, a voltage drop across the current detection resistor becomes greater than a sum of the emitter-to-base voltage of the first transistor and cut-in voltage of the protection diode. As a result, the protection diode is rendered conductive to permit a current to flow therethrough. For this reason, the current mirror circuit provides a current negative feedback to the base of the output transistor means, restricting the collector current of the output transistor.

This invention will be more fully described by way of example by referring to the accompanying drawings.

FIG. 2 is a schematic circuit diagram of a signal amplifier circuit embodying this invention;

FIG. 3 shows a modified form of the circuit of FIG. 2 which is suitable for an integrated circuit; and FIG. 4 is a modification of this invention.

In an embodiment of this invention as shown in FIG. 2 like reference numerals are employed to designate like parts or elements corresponding to those shown in the circuit arrangement of FIG. 1, and further explanation thereof is omitted for simplicity.

Figure 1:
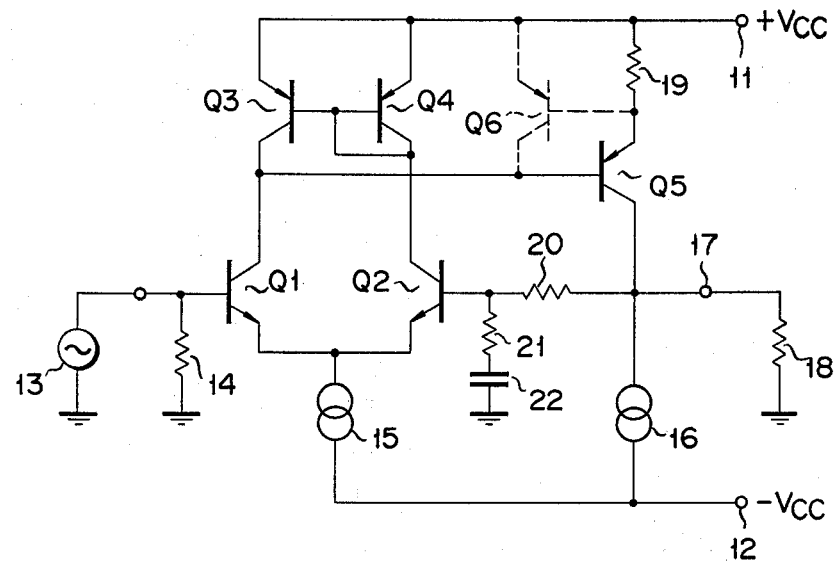
FIG. 1 is a schematic circuit diagram of a conventional output current restricting signal amplifier circuit.

According to this invention, as apparent from FIG. 2, a protection diode D is connected between the collector of diode-connected transistor Q4 in the current mirror load circuit of input amplifying stage and the connection point between the emitter of output transistor Q5 and the current detection resistor 19. The protection diode D is rendered conductive when a voltage drop across the current detection resistor 19 becomes greater than a sum (about 1.4 V) of the emitter-base voltage Vbe3 of transistor Q3 and cut-in voltage Vc of the diode D, permitting a current to flow therethrough. At the normal condition, a voltage drop across the resistor 19 is relatively small and thus the diode D is not rendered conductive. When the output terminal 17 is shortcircuited the collector current of the transistor Q5 much more increases than in normal condition, permitting a current to flow through the diode D.

When a current flows through the protection diode D the collector current $I_{C3}$ of transistor Q3 increases according to the diode current. Since the base current $I_{B5}$ of output transistor Q5 is equal to the collector current $I_{C1}$ of transistor Q1 minus the collector current $I_{C3}$ of transistor Q3, the base current of output transistor Q5 decreases with an increase in $I_{C3}$. As a result, the collector current $I_{C5}$ of output transistor is restricted to a level below $$I_{C5(MAX)} \approx \frac{V_{be3} + V_c}{Re}$$

That is, when a current in excess of the restricting current flows through the output transistor Q5 a current negative feedback is provided to the base of transistor Q5 which restricts the current of transistor Q5 to a level below the restricting current.

When, by way of example, $+V_{cc} = +10$ V, $-V_{cc} = -10$ V, Re=100 ohms and $V_{be3} + V_c \approx 1.4$ V, $I_{C5(MAX)}$ of the output transistor Q5 in the circuit arrangement of FIG. 1 using no protection transistor Q6 is $$I_{C5(MAX)} = \frac{V_{cc}}{Re} = \frac{10}{100} = 100 \text{mA}$$

while in the circuit arrangement of FIG. 2

$$I_{C5(MAX)} \approx \frac{V_{be3} + V_c}{Re} = \frac{1.4}{100} = 14 \text{mA}$$

That is, when Re of the circuit arrangement of this invention is equal to that of the conventional circuit arrangement, it is possible to use an output transistor whose current capacity is more smaller than that of the conventional circuit arrangement. When, on the other hand, an output transistor of the same current capacity is used, a current detection resistor of a fairly smaller resistance can be used and thus the maximum output voltage can be increased.

As the protection diode D is connected to the bases of transistors Q3 and Q4 having a sufficiently low impedance it is possible to prevent an unwanted oscillation.

The circuit arrangement of this invention as shown in FIG. 2 is very suitable to an integrated circuit. That is, the current mirror transistors Q3, Q4, transistor Q2 and protection diode D constituted of a diode-connected transistor can be formed on a common isolation region, thereby decreasing a chip size.

FIG. 3 shows a circuit arrangement more suitable to an integrating circuit, in which an output transistor means is constituted of an inverted Darlington circuit composed of a PNP transistor Q7 and NPN transistor Q8. Stated in more detail, the transistor Q7 has its base connected to the collector of transistor Q3, its collector connected to the base of the transistor Q8 and its emitter connected to the collector of the transistor Q8, and the transistor Q8 has its collector connected to the current detection resistor 19 and its emitter connected to the output terminal 17. Such inverted Darlington circuit is equivalent to the PNP output transistor Q5 of FIG. 2. In the inverted Darlington circuit, the base of transistor Q7 corresponds to the base of transistor Q5; the emitter of the transistor 8 corresponds to the collector of transistor Q5; and the emitter of transistor Q7 and the collector of transistor Q8 correspond to the emitter of transistor Q5. The emitter of transistor Q7 may be connected to the positive power supply terminal 11, as indicated by dotted line, in place of the collector of transistor Q8. The circuit arrangement of FIG. 3 is suitable for an integrated circuit since the last stage transistor through which a relatively large current flow is formed of an NPN type transistor which can be easily fabricated on an integrated circuit.

In the circuit arrangement of this invention the first stage amplifier is not limited to a differential amplifier and may be an amplifier of another type provided it has a current mirror load circuit. For example, the first stage amplifier may be arranged as shown in FIG. 4. That is, the collector of transistor Q3 is connected to the collector of transistor Q1 having its base connected to receive an input signal and its emitter connected to ground through a resistor 23, while the collector of transistor Q4 is connected to ground through a constant current source 24. The collector of output transistor Q5 is connected to the emitter of transistor Q1 via a feedback resistor 25.

What is claimed is:

1. A signal amplifier circuit arrangement comprising:

an input amplifying circuit having a current mirror load circuit comprised of first and second transistors of a first conductivity type each having an emitter, collector and base, said emitters of said first and second transistors being connected to a power supply terminal, said bases of said first and second transistors connected to each other and said collector of said second transistor being coupled to said base of said second transistor;

output transistor means having first, second and third terminals respectively corresponding to emitter, collector and base of a transistor of the first conductivity type, said third terminal of said output transistor means being connected to said collector of said first transistor and said second terminal of said output transistor means being connected to an output terminal of said signal amplifying circuit to be connected to a load;

a current detection resistance element connected between said first terminal of said output transistor means and said power supply terminal; and a diode means connected between said collector of said second transistor and said first terminal of said output transistor means, said diode means being rendered conductive when a voltage drop across said current detection resistance element is greater than a sum of emitter-base voltage of said first transistor and cut-in voltage of said diode.

2. A signal amplifier circuit arrangement according to claim 1, in which said input amplifying circuit is a differential amplifier circuit.

3. A signal amplifier circuit arrangement according to claim 2, in which a first input of said differential amplifier circuit is connected to receive a signal to be amplified and a second input of said differential amplifier circuit is connected to said output terminal of said signal amplifier circuit through a negative feedback circuit.

4. A signal amplifier circuit arrangement according to claim 1, in which said output transistor means includes a third transistor of said first conductivity type and a fourth transistor of a second conductivity type, said third transistor having its base connected to said collector of said first transistor, its emitter connected to said current detection resistance element and its collector connected to a base of said fourth transistor, and said fourth transistor having its collector connected to said current detection resistance element and its emitter connected to said output terminal of said signal amplifier circuit.

5. A signal amplifier circuit arrangement according to claim 1, said output transistor means includes a third transistor of said first conductivity type and fourth transistor of a second conductivity type, said third transistor having its base connected to said collector of said first transistor, its emitter connected to said power supply terminal and its collector connected to a base of said fourth transistor, and said fourth transistor having its collector connected to said current detection resistance element and its emitter connected to said output terminal of said signal amplifier circuit.

* * * * *